United States Patent [19]

Doeling

[11] Patent Number: 4,856,184

[45] Date of Patent: Aug. 15, 1989

[54] METHOD OF FABRICATING A CIRCUIT BOARD

[75] Inventor: Wallace D. Doeling, Beaverton, Oreg.

[73] Assignee: Tektronix, Inc., Beaverton, Oreg.

[21] Appl. No.: 202,621

[22] Filed: Jun. 6, 1988

[51] Int. Cl.⁴ .............................................. H01K 3/10
[52] U.S. Cl. ......................................... 29/852; 29/846
[58] Field of Search ................. 29/846, 852; 174/68.5; 361/414

[56] References Cited

U.S. PATENT DOCUMENTS 4,788,766  12/1988  Burger et al. ...................... 29/852 X

FOREIGN PATENT DOCUMENTS 118202  11/1979  Japan ...................................... 29/852

Primary Examiner—Timothy V. Eley
Attorney, Agent, or Firm—John Smith-Hill; Robert S. Hulse

[57] ABSTRACT

A circuit board is fabricated from a substrate of dielectric material having at least one run of conductive material adhered to one surface thereof. A second substrate of dielectric material is bonded to the one surface of the first substrate so as to cover the run of conductive material. A hole is formed through the first and second substrates and intercepts the run of conductive material. Conductive material is introduced into the hole and establishes electrically conductive contact with the run of conductive material. The diameter of the hole is at least as great as the width of the run of conductive material where it is intercepted by the hole.

4 Claims, 1 Drawing Sheet

METHOD OF FABRICATING A CIRCUIT BOARD

BACKGROUND OF THE INVENTION

This invention relates to a method of fabricating a circuit board.

It is at present known to manufacture a multilayer circuit board from multiple composite sheets each comprising a substrate of dielectric material having a foil of conductive material, such as copper, adhered to one surface thereof. The copper foil of the first composite sheet is patterned so as to define a first layer of conductor runs, and the second sheet is bonded to the first sheet, with its copper foil away from the first sheet. The copper foil of the second sheet is patterned to define a second layer of conductor runs. Generally, it is desired that there be connections between conductor runs of the first layer and conductor runs of the second layer. This is accomplished by drilling holes through the the first and second sheets before the copper foil of the second sheet is patterned, and electrolessly plating copper into the holes. If the holes are properly positioned, the through-hole plating establishes a conductive via between a conductor run of the second layer and a conductor run of the first layer.

Of course, this same procedure may be applied to circuit boards having three or more layers of conductor runs, and in such case may be used to interconnect runs of more than two layers.

When multilayer circuit boards were first introduced, the through-hole metal was provided not by plating but by insertion of a metal eyelet into the hole. At that time, it was felt that it was necessary for there to be contact with the eyelet around its entire periphery in order for there to be an adequate electrical connection between the eyelet and a conductor run. Accordingly, at the locations at which through holes were to be made, the conductor runs of the first layer were formed with enlarged pads. For example, a conductor run might be 20 mil wide (one mil is 0.001 inch, or 0.0254 mm) and terminate in a pad that is 40 mil in diameter. A hole that is perhaps 30 mil in diameter is drilled through the pad.

Modern circuit board fabrication techniques allow conductor runs that are six or eight mil wide. However, it has not been possible to reduce the size of the pads proportionately, because the pads must be larger than the through hole, and the through holes cannot be less than about 30 mil diameter, since if they were any smaller the drill bit would be too fragile.

As the width of conductor runs has decreased, the proportion of a conductor layer that is occupied by pads has increased. In a typical circuit board, pads occupy about 30 percent of the area of each conductor layer. Moreover, where the distance between through holes is limited, for example because the through holes serve not only to accommodate a via but also as mounting holes for a component, the pads limit the number of conductor runs that can pass between the holes.

SUMMARY OF THE INVENTION

It has been recognized that through-hole metal that has been plated does not need to contact a conductor run around the entire periphery of the hole in order to ensure satisfactory electrical connection between the plated metal and the conductor run. Accordingly, a preferred embodiment of the present invention in a first aspect is a method of fabricating a circuit board, comprising providing a substrate of dielectric material having at least one run of conductive material adhered to one surface thereof, and bonding a second substrate of dielectric material to the one surface of the first substrate so as to cover the run of conductive material. A hole is formed through the first and second substrates and intercepts the run of conductive material. Conductive material is introduced into the hole and establishes electrically conductive contact with the run of conductive material. The diameter of the hole is at least as great as the width of the run of conductive material where it is intercepted by the hole.

A preferred embodiment of the invention in a second aspect is an article of manufacture, comprising a first substrate of dielectric material having at least one run of conductive material adhered to one surface thereof. A second substrate of dielectric material is bonded to said one surface of the first substrate, so as to cover the run of conductive material. A hole extends through the sheets of dielectric material and intercepts the run of conductive material. Conductive material in the hole is in electrically conductive contact with the run of conductive material. The diameter of the hole is at least as great as the width of the run of conductive material at the periphery of the hole.

BRIEF DESCRIPTION OF THE DRAWINGS

For a better understanding of the invention, and to show how the same may be carried into effect, reference will now be made, by way of example, to the accompanying drawings in which.

DETAILED DESCRIPTION

Figure 1:
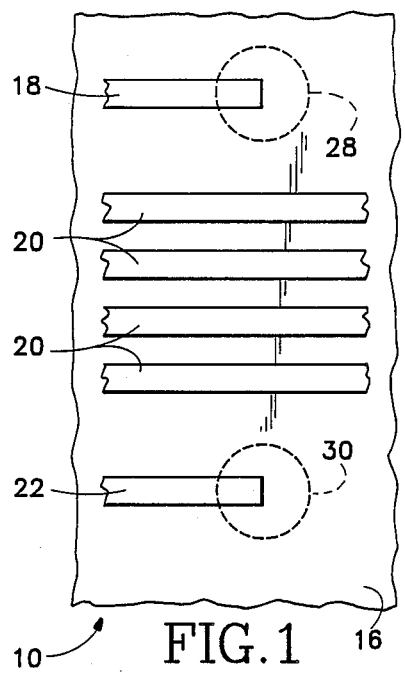
FIG. 1 is a partial top plan view of a first composite sheet that forms part of a circuit board.
Figure 2:
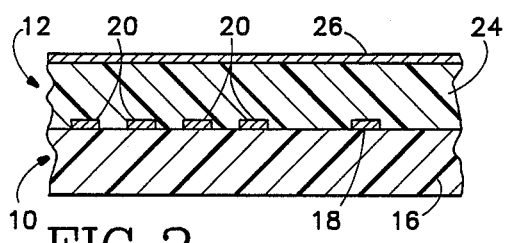
FIGS. 2–5 are sectional views illustrating successive stages in fabrication of the circuit board.

FIG. 1 illustrates a first composite dielectric/metal sheet 10, which will be bonded to a second composite dielectric/metal sheet 12 (FIG. 2). The composite sheet 10 comprises a substrate 16 of dielectric material, such as epoxy glass, and an inner conductor layer, comprising copper runs 18, 20, 22 that are adhered to the upper surface of the substrate. The copper runs are formed in conventional fashion, by patterning a continuous copper foil that is adhered to the upper surface of the substrate 16. The runs 18 and 22 terminate in the area that is shown in FIG. 1, while the runs 20 pass through that area. The end regions of the runs 18 and 22, i.e., the regions in the immediate vicinity of the ends of the respective runs, are of substantially uniform width, so that the runs do not terminate in pads.

Figure 3:
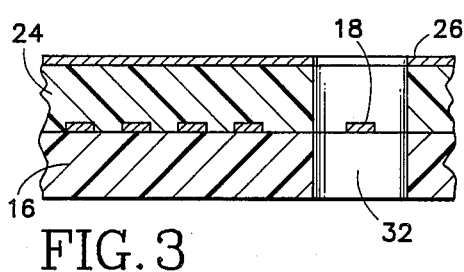

As shown in FIG. 2, the second composite sheet 12 comprises a substrate 24 of dielectric material and a continuous copper foil 26 that is adhered to one surface of the substrate. The second composite sheet 12 is bonded to the first composite sheet 10, using, for example, a dry film adhesive material (not shown). In due course, the foil 26 will be patterned to define conductor runs that are electrically connected to the runs 18 and 22 respectively by vias formed by through-hole plating. Accordingly, after the sheet 12 has been bonded to the sheet 10, and before patterning of the foil 26, holes are drilled through the sheets 10 and 12 at the desired locations of the vias. These locations are indicated by dashed-line circles 28 and 30 in FIG. 1, and the hole at the location 28 is indicated by the reference numeral 32 in FIG. 3. The holes penetrate the foil 26 and intercept the runs 18 and 22 respectively. That is, the runs 18 and 22 are exposed at the interiors of the holes respectively. The diameters of the respective holes are greater than the widths of the runs that they intercept.

Figure 6:
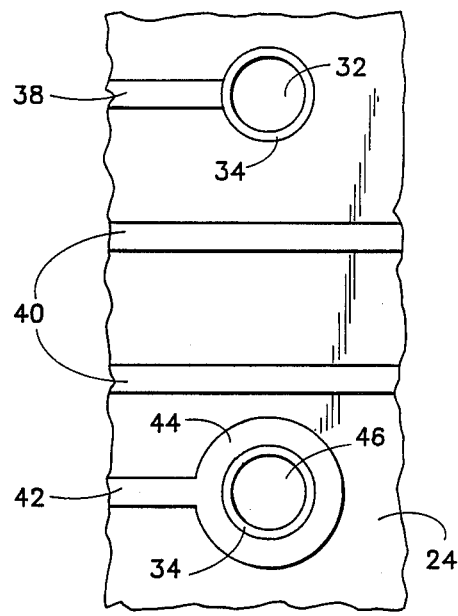
FIG. 6 is a partial top plan view of the completed circuit board.
Figure 4:
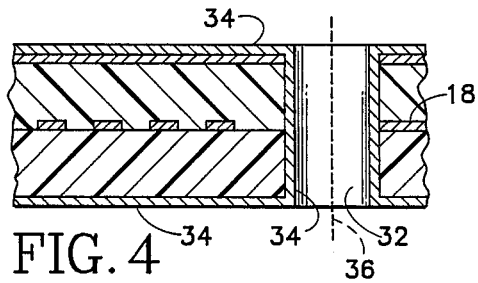
Figure 5:
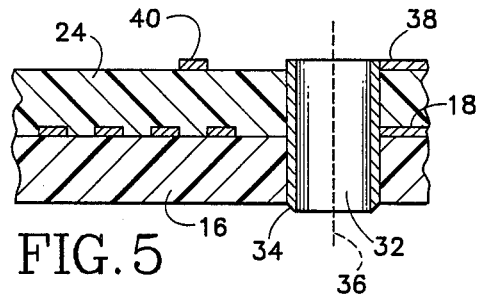

The assembly of the sheets 10 and 12 is then plated electrolessly with a copper layer 34 (FIGS. 4 and 5), and accordingly copper is deposited inside the through holes and forms electrical connections between the runs 18 and 22 and the foil 26. (In FIGS. 4 and 5, the view shown on the right of the dashed line 36 is taken on a section line at right angles to the view on the left of the line 36, in order to show the connection between the run 18 and the through-hole plating.) After the electroless plating step, the layer 34 is removed where it covers the bottom surface of the substrate 16 and the upper surface of the foil 26. The foil 26 is then patterned (FIGS. 5 and 6), and an outer conductor layer, including conductor runs 38, 40 and 42 and a pad 44, is thereby defined. The conductor run 38 is connected to the run 18 by the through-hole metal in the hole 32, and the run 42 is connected to the run 22 by the pad 44 and the metal in the hole 46. The pad 44 is defined because the hole 46 that contains the via that connects the runs 22 and 42 is to be used as a component mounting hole, and the pad 44 enables a good solder fillet to be provided when the component is soldered to the circuit board. The hole 32 does not serve as a component mounting hole, and therefore the run 38 is not provided with a pad. If components are mounted to the circuit board using surface mount technology, no pads are required. In any event, even if the outer layer includes pads, it is not necessary for the inner layer to include pads.

It will be appreciated that the present invention is not restricted to the particular embodiment that has been described, and that variations may be made therein without departing from the scope of the invention as defined in the appended claims and equivalents thereof.

I claim:

1. An improved method of fabricating a circuit board, comprising the steps of:
    (a) providing a first substrate of dielectric material having at least one run of conductive material adhered to one surface thereof,
    (b) bonding a second substrate of dielectric material to said one surface of the first substrate, so as to cover the run of conductive material.
    (c) forming a hole through the first and second substrates of dielectric material, which hole intercepts the run of conductive material, and
    (d) depositing conductive material into the hole, the deposited conductive material being in electrically conductive contact with the run of conductive material,
    wherein the improvement resides in that the diameter of the hole is at least as great as the width of the run of conductive material where it is intercepted by the hole.

2. A method according to claim 1, wherein the second substrate of dielectric material has a layer of conductive material adhered to one surface thereof, said one surface of the second substrate being the surface thereof that is farther from the first substrate, and the method further comprises:
    (e) patterning the layer of conductive material on said one surface of the second substrate so as to define at least one run of conductive material in electrically conductive contact with the conductive material deposited in step (d).

3. A method according to claim 1, wherein the run of conductive material adhered to said one surface of the first substrate is of substantially uniform width over substantially its entire length.

4. A method according to claim 1, wherein step (d) is performed by electroless plating.

* * * * *